United States Patent [19]

Rourke et al.

[11] Patent Number: 4,701,397
[45] Date of Patent: Oct. 20, 1987

[54] METHOD FOR FORMING IMAGES ON PLAIN PAPER AND AN IMAGING SHEET USEFUL THEREIN

[75] Inventors: John K. Rourke, Chillicothe; Joseph G. O'Connor, Springboro, both of Ohio

[73] Assignee: The Mead Corporation, Dayton, Ohio

[21] Appl. No.: 834,097

[22] Filed: Feb. 26, 1986

[51] Int. Cl.⁴ .................... G03C 1/00; G03C 1/72; G03C 5/00
[52] U.S. Cl. .................... 430/138; 430/211; 430/235; 430/254
[58] Field of Search ............... 430/138, 254, 211, 235

[56] References Cited

U.S. PATENT DOCUMENTS

| | | | |
|---|---|---|---|
| 3,016,308 | 1/1962 | Macaulay | 430/254 |
| 3,219,446 | 11/1963 | Berman | 96/28 |
| 3,607,264 | 9/1971 | Celeste et al. | 430/254 |
| 3,736,138 | 5/1973 | Held et al. | 430/254 |
| 4,440,846 | 4/1984 | Sanders et al. | 430/138 |
| 4,474,898 | 10/1984 | Matsusita | 503/203 |
| 4,486,764 | 12/1984 | Matsushita | 346/209 |
| 4,501,809 | 2/1985 | Hiraishi et al. | 430/138 |

FOREIGN PATENT DOCUMENTS 4006212 2/1974 Japan ...................... 430/271

Primary Examiner—Roland E. Martin
Assistant Examiner—Mukund J. Shah
Attorney, Agent, or Firm—Biebel, French & Nauman

[57] ABSTRACT

An imaging sheet useful in forming images on plain paper, said sheet comprising a support having a plurality of photosensitive microcapsules and a developer-containing resin on the surface thereof, said microcapsules and said developer-containing resin being present in the same layer or in contiguous layers on the surface of said support, said microcapsules containing an internal phase which includes a photosensitive composition which changes in viscosity in response to exposure to actinic radiation and a color former which is capable of reacting with said developer and forming a visible dye image, said imaging sheet being useful in forming images by a process which comprises image-wise exposing said imaging sheet to actinic radiation, assembling said imaging sheet with a sheet of plain paper, heating said assembly, subjecting the assembly to a uniform rupture and transfer force, and separating said imaging sheet from said paper such that said image areas are area-wise transferred to said plain paper.

8 Claims, 4 Drawing Figures

METHOD FOR FORMING IMAGES ON PLAIN PAPER AND AN IMAGING SHEET USEFUL THEREIN

BACKGROUND OF THE INVENTION

The present invention relates to a method for forming images using an imaging sheet which carries a layer of microcapsules containing a photosensitive composition and a color former. More particularly, it relates to a method for forming images by image area-wise transfer of a coating containing said microcapsules and a developer-containing resin to the surface of a sheet of plain paper and to a novel imaging sheet useful therein.

U.S. Pat. No. 4,399,209 to The Mead Corporation describes a transfer imaging system wherein an imaging sheet comprising a support and a layer of microcapsules containing a chromogenic material and a photosensitive composition is image-wise exposed to actinic radiation. The exposed sheet is assembled with a developer sheet and the two are passed through a calender nip whereupon the microcapsules rupture and the contents of the microcapsules are image-wise transferred to the developer sheet where they react and form a colored image.

Typically, the photosensitive composition is a photocurable composition containing an ethylenically unsaturated compound and a photoinitiator. The chromogenic material is a substantially colorless electron-donating color former, and the developer is an electron-acceptor such as an aromatic carboxylic acid salt which is capable of reacting with the color former and forming a visible dye image. Upon image-wise exposing the imaging sheet to actinic radiation, the internal phase of the microcapsules is hardened in the exposed areas. The internal phase remains liquid in the unexposed areas and the internal phase may be hardened to an intermediate degree in areas receiving an intermediate level of exposure. Thus, the microcapsules in the unexposed areas are capable of rupturing and releasing the internal phase upon subjecting the exposed imaging sheet to a uniform rupturing force. The microcapsules in the underexposed areas may rupture and release the internal phase to an intermediate degree, however, in the exposed areas, the hardened photosensitive composition prevents the microcapsules from releasing the internal phase. In this manner, the internal phase of the microcapsules is imagewise released and transferred to the developer sheet where the image is formed.

While the transfer imaging system described in U.S. Pat. No. 4,399,209 can be used in numerous formats and applications, the user usually must purchase two coated paper products to reproduce images; namely, the imaging sheet and the developer sheet. This has several disadvantages. If the imaging sheet and the developer sheet are not designed to be used together, image quality may not be up to standard. More importantly, the developer sheet does not have the appearance, tactility, and other physical properties found in office bond paper. The developer material may also yellow with time. Thus, when an image is formed on a uniformly coated developer sheet, the developer in some cases, overtime, detracts from the quality of the image. In principle, these problems can be reduced in copying on plain paper, because the developer is not present in the background areas and, hence, there is less tendency for it to yellow. However, several problems have been encountered in attempts to copy on plain paper. Image quality is not as good as it is in copying on a developer sheet. Plain paper tends to be substantially rougher than developer paper and as a result, images often appear grainy.

SUMMARY OF THE INVENTION

A principal object of the present invention is to provide a process for forming images on plain paper by image area-wise transfer of a self-contained coating comprising a developer-containing resin and a microencapsulated photosensitive composition containing a color former. The developer-containing resin is provided on an imaging sheet in the same layer as a microencapsulated photosensitive composition or in a contiguous layer. Images are formed by image-wise exposing the imaging sheet to actinic radiation, assembling the imaging sheet with a sheet of plain paper, heating the assembly, and subjecting the assembly to a uniform rupturing and transfer force. (The steps of heating the assembly and subjecting the assembly to a uniform force may be carried out at the same time using a heated pressure roller.) Upon heating and application of the rupture and transfer force, the microcapsules image-wise release the internal phase, the color former reacts with the developer and, the image areas become adhered to the plain paper's surface. Upon separating the imaging sheet from the plain paper, the image areas are selectively transferred to the plain paper while the non-image areas remain adhered to the imaging sheet. In accordance with the present invention, both color former and developer-containing resin are transferred, as a unit, to the paper sheet. A less grainy image of enhanced optical density is thereby obtained.

The term "developer-containing resin" is used herein to refer to both admixtures of developers such as salicylic acid derivatives and resins and developer resins such as phenolic resins which are capable of reacting with a color former and producing a visible image. The developer-containing resins used in the present invention are characterized in that they exhibit the properties of hot melt adhesives. That is, upon heating they melt and bond to an adjacent surface and, upon cooling they return to the solid state. Mixtures of hot melt adhesives and developer compounds are used in accordance with one embodiment of the invention. On the other hand phenolic resins which both exhibit the properties of a hot melt adhesive and function as a developer are used in the preferred embodiments.

The resins which are preferably used in the present invention are further characterized in that, upon heating in the presence of the internal phase released from the microcapsules, they preferentially adhere to the surface of plain paper as opposed to the developer sheet surface; whereas, in the absence of the internal phase, the resin remain selectively adhered to the imaging sheet support. It can be seen that this property is a function of both the developer-containing resin and the adhesive characteristics (e.g., surface area and surface energy) of the plain paper surface and the surface of the imaging sheet support. To a degree, it is also subject to the magnitude of the transfer force and the degree of heating, although, the transfer force and degree of heating are naturally adjusted such that with the appropriate selection of developer, donor support and paper, selective adhesion is achieved.

The released internal phase may interact with the developer-containing resin to provide selective adhesion of the image-forming coating to the paper surface by a combination of mechanisms. While not desiring to be bound, the principal action of the internal phase with the developer-containing resin appears to be that of a release or slipping agent. The internal phase has an oily consistency. Typically it contains monomers such as polyethylenically unsaturated compounds, a photoinitiator system, and color former. The principal constituent is the monomer. The internal phase or monomer is believed to reduce the degree of adhesive characteristics of the developer-containing resin. Due to the higher surface area of the paper surface as compared to the imaging sheet support, the resin adheres to it in preference to the imaging sheet support in the areas in which the internal phase is released. In the areas in which the internal phase is not released, the developer-containing resin remains sufficiently adhered to the imaging sheet support to resist delamination.

Depending upon the composition of the internal phase and the nature of the resin, one or more components of the internal phase may also swell or tackify the developer-containing resin such that the resin adheres to the plain paper in the image areas. Upon separating the imaging sheet from the paper, the resin carrying the contents of the internal phase adheres to the surface of the paper and is transferred.

In accordance with the invention, as explained in more detail below, transfer of the self-contained coatings occurs area-wise as opposed to on a point-by-point basis. Thus, the coating in the entire image area is transferred to the paper surface. This area-wise transfer is advantageous because it enhances the transfer of the internal phase itself and provides a less grainy image. In prior practices, only a portion of the internal phase released from the microcapsules is transferred. For example, due to the irregular surface of bond paper, there are a limited number of contact points between the face of the paper and the imaging sheet. In previous systems, migration of the internal phase of paper surface is limited to these points of contact. Area-wise transfer of the internal phase via the developer-containing resin in accordance with the present invention places a higher proportion of the internal phase on the paper surface. The entire image area becomes adhered to the paper surface and transfer is not limited to the points of contact. A less grainy image of enhanced optical density is thereby obtained.

A particularly preferred class of developer resins for use in the present invention is phenolic developer resins and, more particularly, alkylated phenolic developer resins. These resins are the reaction products of formaldehyde and one or more phenols such as ortho- or para-substituted alkylphenols. The polymers are characterized in that they are thermoplastic, e.g., they have melting points in the range of about 100° to 180° C. The resins are preferably metallated and, more particularly, zincated. Still more particularly, they are zincated products of the reaction of salicylic acid, and alkylphenol and formaldehyde. They are often obtained and applied to the imaging sheet as aqueous emulsions or dispersions containing about 50% solids and having a particle size of about 1.5 to 2.0 microns.

Accordingly, one manifestation of the present invention resides in an imaging sheet comprising:

a support having a plurality of photosensitive microcapsules and a developer-containing resin on the surface thereof, said microcapsules and said developer-containing resin being present on the surface of said support in the same layer or in contiguous layers, said microcapsules containing an internal phase which includes a photosensitive composition which changes in viscosity in response to exposure to actinic radiation and a color former which is capable of reacting with said developer and forming a visible dye image, said imaging sheet being capable of forming images on plain paper by a process which comprises image-wise exposing said imaging sheet to actinic radiation to form latent image and non-image areas, assembling said imaging sheet with a sheet of plain paper, heating said assembly, subjecting said assembly to a uniform rupture and transfer force, and separating said imaging sheet from said paper wherein said image areas are area-wise transferred to said plain paper.

Another manifestation of the present invention is a process for forming images on plain paper which comprises image-wise exposing the imaging sheet to actinic radiation to form latent image and non-image areas, assembling said imaging sheet with a sheet of plain paper such that said microcapsules and said developer-containing resin are interposed between the surface of said support and said paper, heating said assembly, subjecting said assembly to a uniform force such that said microcapsules rupture and said developer-containing resin selectively adheres to the surface of said plain paper in the image areas and said developer-containing resin remains adhered to said support in the non-image areas, and separating said imaging sheet from said plain paper.

DEFINITIONS

The term "microcapsule" as used herein includes both microcapsules having discrete walls and microcapsules within a so-called open phase system consisting of a dispersion of the internal phase constituents in a binder.

The term "photosensitive composition" as used herein means compositions which directly or indirectly undergo a change in viscosity in response to actinic radiation. The term includes compositions in which the change in viscosity is induced by heating. Both photohardenable and photosoftenable compositions fall within the scope of this term.

The term "actinic radiation" includes the entire electromagnetic spectrum including ultraviolet and infrared radiation.

The term "plain paper" as used herein refers to paper which is not coated with a developer material. It includes a bond paper as well as papers which are treated or manufactured using techniques which enhance the quality of the image obtained in accordance with the present invention. It includes papers in which surface irregularities (roughness) are minimized.

DETAILED DESCRIPTION OF THE INVENTION

The photosensitive microcapsules used in the present invention can be prepared as described in commonly assigned U.S. Pat. Nos. 4,399,209; 4,440,846; and 4,482,624.

Figure 1:
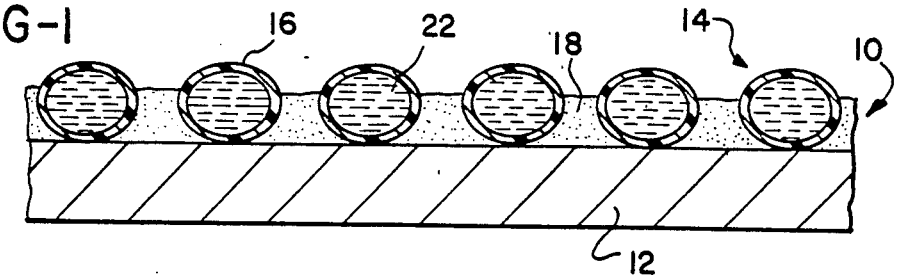
FIGS. 1–4 schematically illustrate an imaging sheet and a process in accordance with one embodiment of the present invention.

An imaging sheet in accordance with the present invention is shown in FIG. 1 and is generally designated by reference numeral 10. The imaging sheet 10 includes a support 12 having a photosensitive layer 14 on the surface thereof. The layer 14 includes photosensitive microcapsules 16 and a phenolic developer resin 18. The microcapsules 16 and developer resin 18 do not need to be coated in the same layer, but can be coated in contiguous layers with the microcapsules underlying or overlying a layer of the developer resin. In the preferred embodiment of the invention, the support 12 is a then polymeric film. If the support 12 is transparent, the imaging sheet can be exposed from either surface. The developer layer 18 is not necessarily a film but may preferably consist of finely divided particles as can be obtained when the developer-containing resin is a dispersion. Similarly, the layer 18 is not necessarily continuous but may be interrupted by pores or capillaries particularly where the developer-containing resin is coated on the support from a dispersion.

Figure 2:
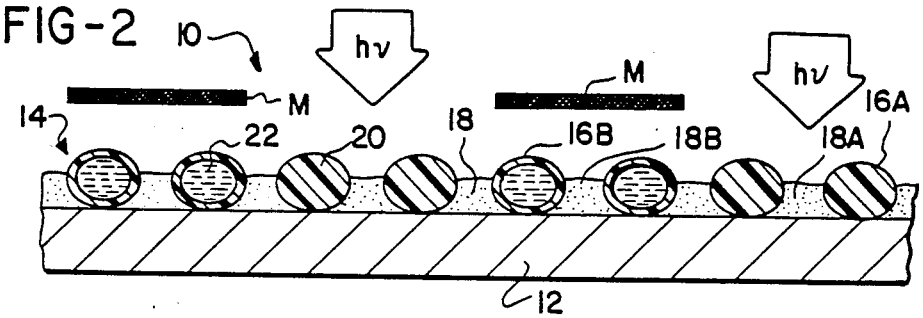

FIG. 2 illustrates exposure of the imaging sheet 10 to actinic radiation (h $\nu$) through a mask M for the embodiment of the invention in which the microcapsules contain a radiation-curable or photohardenable composition. Exposure has the effect of solidifying the internal phase 20 of the microcapsules 16A in the exposed areas, whereas, the internal phase 22 of microcapsules 16B in the unexposed areas remains liquid. In this embodiment, the latent image areas are made up of microcapsules 16B and the associated developer-containing resin 18B and the latent non-image areas contain microcapsules 16A and the associated developer-containing resin 18A. In this regard, while internal phases 20 and 22 are illustrated as being respectively solid and liquid, those skilled in the art will appreciate that the change in the internal phase may be from a liquid to a semisolid form, or from a semisolid to a more solid form.

The mechanism whereby the microcapsules rupture and release the internal phase is explained in more detail in U.S. Pat. No. 4,399,209. Exposure alone or in conjunction with heating effects a change in the viscosity of the internal phase such that the internal phase is differentially released from the microcapsules in the exposed and unexposed areas upon subsequent application of the rupture and transfer force as described below.

Figure 3:
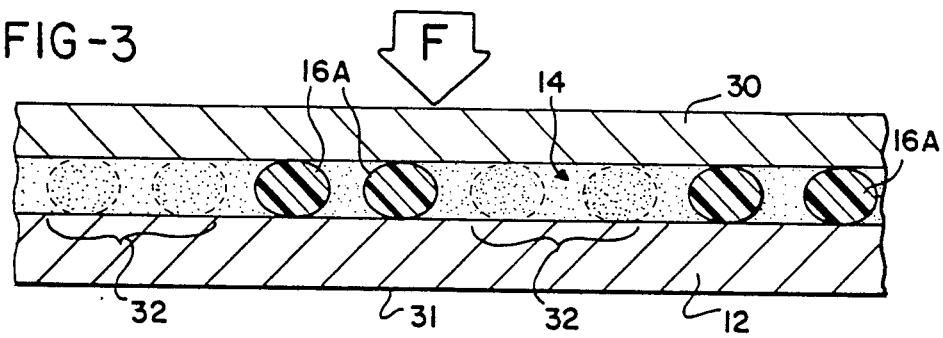

After exposure, the imaging sheet 10 is assembled with a sheet of plain paper 30 as shown in FIG. 3. The assembly is heated and subjected to a uniform rupturing and transfer force F. These steps are typically performed simultaneously but they may be performed separately. Typically, this force is applied using pressure rollers but it may also be applied by other means such as by rotating a fibrous roller at a high velocity against the back side 31 of the imaging sheet 10 or the paper sheet 30. An example of a fibrous roller is described in U.S. Pat. No. 4,448,516. The use of a fibrous roller is advantageous because it provides a uniform rupture and transfer force without the use of large calander rollers.

The imaging sheet/paper assembly is heated before separating to melt the developer-containing resin. The heating conditions are adjusted depending on the nature of the developer-containing resin, the nature of the internal phase, and the nature of the support for the imaging sheet. Temperatures of about 50° to 150° C. are generally used. In one of the embodiments of the invention, the assembly is heated as the rupturing and transfer force is applied by using heated calender rollers.

Upon application of the rupturing and transfer force, the microcapsules 16B rupture and selectively release the internal phase. As explained in U.S. Pat. No. 4,399,209, the mechanism is not clear. For simplicity, the microcapsules 16A in the exposed latent non-image areas containing solid internal phase 20 are shown as being unruptured, whereas, the microcapsules 16B in the unexposed latent image areas are shown in phantom as having been ruptured and producing an image area 32. The image area 32 results when one or more components of the internal phase (e.g., the unexposed photosensitive composition and/or diluent) interact with the developer-containing resin or the imaging sheet support such that the resin becomes preferentially adherent to the plain paper surface.

Simultaneously, the color former reacts with the developer to produce a visible dye image. Agents may be included in the internal phase to enhance selective adhesion and transfer. For example, an oil (other than the monomer) may be incorporated in the internal phase which penetrates photosensitive layer 14 and reduces adhesion between it and support 12.

Depending upon the nature of the photosensitive composition, intermediate degrees of exposure will produce an intermediate degree of hardening of the internal phase resulting in the chromogenic material being released in an intermediate amount.

Following application of the rupturing and transfer force, the imaging sheet 10 is separated from the developer sheet. The image areas 33 selectively adhere to the paper 30 while the non-image areas 34 remain attached to the support 12. It has been observed that the entire image area 32 is removed from the imaging sheet support 12 and transferred to the paper 30. From this it can be seen that transfer does not occur on a point-by-point or microcapsule-by-microcapsule basis, but that the entire self-contained coating in the image area is transferred to the paper.

Figure 4:
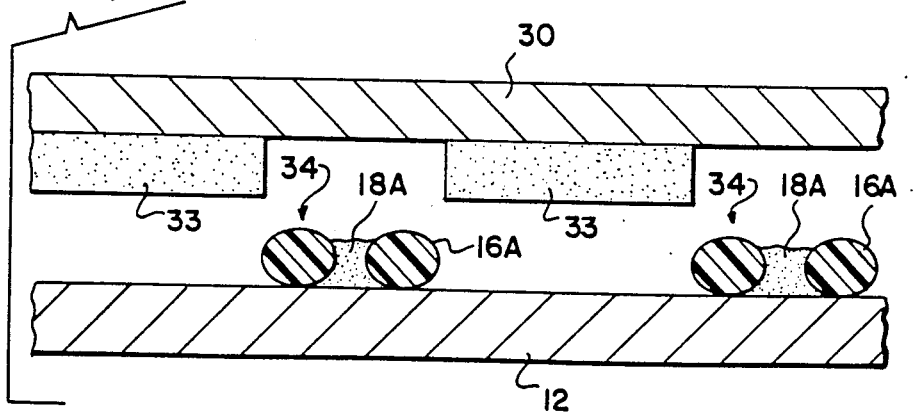

While the resin is FIGS. 1 and 4 is shown in the same manner, the resin 18 in FIG. 1 may be in the form of finely divided thermoplastic particles while the resin 18A in FIG. 4 may be a continuous film as a result of heating and pressure. Image formation and transfer do not appear to be controlled by the identical mechanism. Due to the continuity of the developer resin, transfer occurs areawise, whereas, the image is formed by reaction of the color former and the developer on a point-by-point basis. This is particularly pertinent in forming full color images where a given image area is made up of a combination of exposed and unexposed microcapsules. It appears that the entire image area is transferred but that the image itself is formed by selective exposure-controlled release of the color formers from the microcapsules. The image produced in accordance with the present invention is thus the product of a combination of microcapsules rupturing and releasing their internal phase in accordance with the degree of exposure in the transferred image areas. Full color imaging systems are described in more detail in U.S. application Ser. No. 339,917, filed Jan. 18, 1982.

The developer-containing resins used in the present invention are preferably phenolic developer resins, more particularly, alkylphenolic resins and, still more particularly, metallated products of alkylphenolic resins. A particularly preferred resin is the reaction product of an ortho- or para-substituted alkylphenol, salicylic acid, and formaldehyde.

The alkyl phenols are monosubstituted by the alkyl group which may contain 1 to 12 carbon atoms. Examples of alkyl phenols are ortho or para substituted ethylphenol, propylphenol, butylphenol, amylphenol, hexylphenol, heptylphenol, octylephenol, nonylyphenol, t-butylphenol, t-octylphenol, etc.

The preferred resins are thermoplastic and range from about 100° to 180° C. in their melting or softening point. These resins have properties similar to hot melt adhesives, namely, upon heating they bind to an adjacent surface. Their number average molecular weight is usually in the range of about 500 to 10,000. A particularly preferred resin is available from Schnectady Chemical Inc. under the tradename HRJ 2969. This resin, which is zincated, is formed from a mixture of a higher alkyl phenol and salicylic acid.

The phenolic developer resins used in the present invention may be metallated in a conventional manner to improve their developing characteristics. They may be modified by reaction with a salt selected from the group consisting of copper, zinc, aluminum, tin, cobalt and nickel. Most typically, the resins are zincated to improve development. The metal content of the resins generally is about 1 to 5% but may range up to 15%.

Phenolic (phenol-formaldehyde) developer resins are conventionally formed by condensation polymerization and are often obtained as aqueous dispersions. The dispersions which are used to provide the developer resin coating used in the present invention preferably contain at least 50% by weight solids and range in particle size from about 1.0 to 3.0 microns. The present invention is not, however, limited to the use of developer resins obtained as aqueous dispersions. Aqueous emulsions are also useful, as are also solvent cast resins.

In accordance with another embodiment of the present invention, admixtures of developers and hot melt adhesive resins are used. Resins conventionally used as hot melt adhesives such as phenolic resins, urethanes and ethylene vinyl acetate copolymers, can be used. Developers conventionally used in carbonless paper technology can be admixed with the adhesive. Examples of useful developers include acid clay, active clay, organic acids such as gallic acid and tannic acid, etc., salicylic acid derivatives and salts thereof such as zinc salicylates, tin salicylate, zinc 3,5-di-tert-butyl salicylate, zinc 3,5-di(α-methylbenzyl) salicylate, etc., and condensates of salicylic acid derivatives and formaldehyde. Of course a mixture of a developer resin as previously described and a hot melt adhesive may also be used.

Where the developer-containing resin is an admixture of a developer and a hot melt adhesive, about 5 to 30 parts by weight adhesive is used with 70 to 95 parts developer.

To prepare a self-contained coating in accordance with the present invention, where the developer resin is an aqueous emulsion or dispersion, the emulsion or dispersion of the developer resin can be mixed with an aqueous dispersion of the microcapsules and the mixture coated onto an appropriate support and dried. The weight ratio of developer-containing resin to the microcapsules (as solids) is preferably about 50:50 to 75:25. The ratio selected will depend on the concentration of the color former in the microcapsules. The mixture is usually applied to the imaging sheet support in an amount of about 6 to 12 g/m² on a dry basis.

The microcapsules and developer-containing resin can also be applied in separate layers with the microcapsules preferably forming a layer which overlies or underlies the layer of developer-containing resin. Preferably, when used in separate layers, the developer-containing resin is not interposed between the exposure source and the microcapsules.

The developer-containing resin and microcapsule compositions can be coated using conventional coating techniques such as blade coating, roll coating, etc. It is not clear whether the developer resin, when coated, forms a continuous film or remains in particle form.

The photosensitive compositions useful in the present invention may be photohardenable or photosoftenable compositions. Photohardenable compositions are generally preferred. Examples of both are provided in U.S. Pat. No. 4,399,209. Typically, the photohardenable compositions contain a polyethylenically unsaturated compound and a photoinitiator. Examples of each are provided in U.S. Pat. No. 4,399,209.

Color formers conventionally used in carbonless or pressure-sensitive copy papers are useful in the present invention. Numerous examples are available in the art including Reakt Yellow from BASF, and a series of color formers used under the tradename Copikem from Hilton-Davis Chemical Co. These compounds are generally characterized in that they are electron-donating compounds having a lactone, a lactam, a sultone, a spiropyran, an ester or an amido structure in their partial skeleton.

In some cases, it is possible to enhance the selectivity of transfer by incorporating an organic diluent in the internal phase of the capsules and, more particularly, a wax diluent as described in U.S. application Ser. No. 659,151, filed Oct. 9, 1984 or an oil diluent.

The support for the imaging sheet plays an important role in the process of the present invention in that the self-contained coating must preferably adhere to the support in the non-image areas and adhere to the paper in the image areas. Much of the selectivity observed in the present invention is believed to arise from the difference in surface area of plain paper versus the imaging sheet support. For this reason, a support having a relatively smooth, non-porous surface (and therefore low surface area) as compared to the image-receiving paper is preferably used.

Polymeric films are preferably used as supports for the imaging sheet in the present invention. The adhesive character of these films can be adjusted in a known manner through the use of subbing layers, release agents such as silicones, and treatments such as corona discharge. Preferred polymeric films include Polyesters such as polyethylene terephthalate, polyamides, polyolefins such as polypropylene, etc. The support for the imaging sheet is preferably as thin as practicable. The support is generally less than about 25 microns thick and is preferably about 3 to 12 microns. Thinner supports improve heat transfer efficiency and image resolution when the imaging sheet is exposed through the support.

In accordance with a preferred embodiment of the invention, full color images are formed. In this embodiment, the layer 14 contains a mixture of microcapsules having distinct wavelength sensitivities and containing cyan, magenta, yellow, and optionally black color formers. See U.S. application Ser. No. 339,917, filed Jan. 18, 1982. The microcapsules are mixed and coated with a developer-containing resin as described above. If the microcapsules are respectively sensitive to red, green, and blue light, the imaging sheet can be exposed by direct transmission or reflection imaging. In most cases, however, the microcapsules have distinct sensitivities in the ultraviolet spectrum. In this case, color separation or image processing is required to expose the imaging sheet. Using color separations, the imaging sheet is exposed to three distinct bands of ultraviolet radiation through the color separation in order to control the release and transfer of the cyan, magenta, and yellow color formers. Alternatively, a color image is resolved into its red, green, blue, and optionally black components each of which is then respectively electronically translated into radiation to which the photosensitive composition associated with the complimentary color former is sensitive. The exposure device will control three or four distinct bands of radiation which may be emitted from a single radiation source or a plurality of sources. For example, a Dunn or matrix camera may be used to produce electronic signals corresponding to the cyan, magenta, and yellow (and optionally black) images that are desired. This output drives the electronic control means for an exposure device which may include a conventional multiplexer logic package and timing means. The exposure device selectively drives a radiation source to which the microcapsules on the imaging sheet are sensitive and thereby image-wise exposes the imaging sheet.

Various imaging apparatuses can be used to expose the imaging sheets in the present invention. It is anticipated that the imaging process of the present invention will be used to copy computer generated output and for this purpose certain electronically controlled imaging apparatuses will be used. Typical examples of such electronic imaging apparatuses include light valve imaging apparatuses of the type described in U.S. Pat. Nos. 4,229,095; 4,367,946; and 4,406,521. Cathode ray tubes and certain laser imaging apparatuses can also be used to image-wise expose imaging sheets in accordance with certain embodiments of the present invention.

The process of the present invention can be carried out using plain bond paper, however, it is preferable to use papers which are smoother than most grades of bond paper. It will be noted, however, that other papers may be used. Preferred papers will have the property of retaining a sufficient quantity of the chromogenic material on the surface of the paper where it can react with a dry developer material. Papers which are highly absorbent and which draw the chromogenic material into the paper where it is not accessible to the developer are less desirable. It may be advantageous to use papers which have been surfaced sized to enhance image density. Representative examples of commercially available papers useful in the present invention are bond paper, light weight coated papers, premium coated papers, light weight coated fiber and ground wood papers and newsprint, i.e., light weight ground wood papers.

Having described the invention in detail and by reference to preferred embodiments thereof, it will be apparent that modifications and variations are possible without departing from the scope of the invention defined in the appended claims.

What is claimed is:

1. A process for forming images on plain paper which comprises image-wise exposing an imaging sheet comprising a support having a plurality of photosensitive microcapsules and a developer-containing resin on the surface thereof, said microcapsules and said developer-containing resin being present in the same layer or in contiguous layers on the surface of said support, said microcapsules containing an internal phase which includes a photosensitive composition which changes in viscosity in response to exposure to actinic radiation and a color former which is capable of reacting with said developer and forming a visible dye image, to actinic radiation to form latent image and non-image areas, assembling said imaging sheet with a sheet of plain paper such that said microcapsules and said developer-containing resin are interposed between said support and said paper, heating said assembly, subjecting said assembly to a uniform force which causes said microcapsules to rupture and causes said developer-containing resin and said internal phase from said ruptured microcapsules in said image areas to adhere to the surface of said sheet of plain paper, and separating said imaging sheet from said plain paper whereby said image areas selectively adhere to said plain paper and said non-image areas remain adhered to said support.

2. The process of claim 1 wherein said developer-containing resin is characterized in that upon heating in the presence of said internal phase said developer resin exhibits greater adhesion to the surface of said paper than to said support, whereas, in the absence of said internal phase, said developer-containing resin exhibits greater adhesion for said support than said paper.

3. The process of claim 2 wherein said developer-containing resin is further characterized in that it exhibits the properties of a hot melt adhesive.

4. The process of claim 3 wherein said developer-containing resin is a phenolic resin.

5. The process of claim 1 wherein said microcapsules and said developer resin are present in admixture in a layer on the surface of said support.

6. The process of claim 4 wherein said photosensitive composition includes an ethylenically unsaturated compound.

7. The process of claim 4 wherein said phenolic resin has a melting point of about 100° to 180° C.

8. The process of claim 4 wherein said phenolic resin is present on said support as a finely divided particle.

* * * * *